(12) United States Patent
Wilford

(10) Patent No.: US 6,433,403 B1
(45) Date of Patent: Aug. 13, 2002

(54) INTEGRATED CIRCUIT HAVING TEMPORARY CONDUCTIVE PATH STRUCTURE AND METHOD FOR FORMING THE SAME

(75) Inventor: John R. Wilford, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/295,988

(22) Filed: Apr. 21, 1999

(51) Int. Cl.[7] ............................................... H01L 29/00
(52) U.S. Cl. ..................... 257/529; 257/355; 257/546
(58) Field of Search ................................. 257/355, 529, 257/530, 499, 356, 546; 438/600, 601

(56) References Cited

U.S. PATENT DOCUMENTS

| | | | | |
|---|---|---|---|---|
| 4,198,696 A | * | 4/1980 | Bertin et al. ................ | 365/175 |
| 4,426,658 A | * | 1/1984 | Gontowski et al. ......... | 257/529 |
| 4,714,949 A | * | 12/1987 | Simmons et al. .......... | 257/355 |
| 5,185,291 A | | 2/1993 | Fischer et al. ............. | 437/173 |
| 5,369,054 A | * | 11/1994 | Yen et al. ................... | 438/600 |
| 5,498,895 A | * | 3/1996 | Chen .......................... | 257/355 |
| 5,519,248 A | * | 5/1996 | Yan et al. ................... | 257/530 |
| 5,572,061 A | * | 11/1996 | Chen et al. ................. | 257/530 |
| 5,629,227 A | * | 5/1997 | Chen .......................... | 438/600 |
| 5,661,331 A | * | 8/1997 | Hebbeker et al. .......... | 257/529 |
| 5,691,234 A | | 11/1997 | Su et al. ..................... | 437/186 |
| 5,702,566 A | * | 12/1997 | Tsui ........................... | 156/643.1 |
| 5,760,445 A | * | 6/1998 | Diaz .......................... | 257/356 |
| 5,825,072 A | * | 10/1998 | Yen et al. ................... | 257/530 |
| 5,889,307 A | * | 3/1999 | Duesman .................... | 257/355 |
| 5,910,452 A | * | 6/1999 | Kang et al. ................. | 438/710 |
| 5,998,299 A | | 12/1999 | Krishnan .................... | 438/694 |
| 6,028,324 A | * | 2/2000 | Su et al. ..................... | 257/48 |
| 6,060,347 A | | 5/2000 | Wang ......................... | 438/215 |
| 6,034,433 A | | 9/2000 | Beatty ........................ | 257/758 |

OTHER PUBLICATIONS

Fang and McVittie, "A Model and Experiments for Thin Oxide Damage from Wafer Charging in Magnetron Plasmas," in *IEEE Electron Device Letters* 13(6):347–349, 1992.

Shin et al., "Thin Oxide Damage By Plasma Etching and Ashing Processes," in *IEEE/IRPS*, pp. 37–41, 1992.

Aum, P., et al., *Controlling Plasma Charge Damage in Advanced Semiconductor Manufacturing—Challenge of Small Feature Size Device, Large Chip Size, and Large Wafer Size*, IEEE Transactions on Electron Devices, vol. 45, Mar. 1998, pp. 722–730.

* cited by examiner

*Primary Examiner*—Douglas Wille
(74) *Attorney, Agent, or Firm*—Dorsey & Whitney LLP

(57) ABSTRACT

A sacrificial conductive path formed in an integrated circuit to temporarily couple together semiconductor structures of the integrated circuit. The sacrificial conductive path includes a sacrificial area that severs the electrical continuity when it is removed. The sacrificial conductive path may be used to protect the gate oxide of a capacitive structure from charge related damage during a plasma etch step. The sacrificial structure temporarily couples the conductive layer of the capacitor structure to the substrate to discharge any charge accumulation. The sacrificial area will be removed prior to operation of the integrated device to sever the connection between the gate and the substrate. The sacrificial conductive path may be formed by an interconnect, and the sacrificial area removed by a plasma etch step. The sacrificial conductive path may also be formed by a semiconductor fuse having a sacrificial area that is removed by laser trimming.

35 Claims, 4 Drawing Sheets

INTEGRATED CIRCUIT HAVING TEMPORARY CONDUCTIVE PATH STRUCTURE AND METHOD FOR FORMING THE SAME

TECHNICAL FIELD

The present invention is related generally to semiconductor structures of integrated circuits, and more specifically, to a structure and method of temporarily coupling together semiconductor structures of an integrated circuit.

BACKGROUND OF THE INVENTION

During the manufacture of integrated circuits, electrical components are formed on a semiconductor substrate through a number of process steps. For example, a typical process for forming metal oxide semiconductor ("MOS") transistors includes the steps of forming an oxide layer on a surface of a silicon substrate and a conductive gate layer on the oxide layer, masking portions of the conductive gate layer, removing unmasked portions of the conductive gate and oxide layers, and doping regions of the silicon substrate exposed by the removed portions of the gate and oxide layers. After the formation of the MOS transistors and other desired components, the resulting structure is patterned to form contact vias over portions of the components. For example, a contact via may be formed over the gate of a MOS transistor. The gate is then coupled by depositing a conductive layer in the contact via to provide interconnection among the components fabricated on the substrate.

After the conductive layer has been deposited, it is masked with a pattern of interconnections, and the unmasked portions of the conductive layer are removed by etching. The portions of the conductive layer remaining after the etch step form the interconnections of the integrated circuit. Several conventional etching techniques may be used to remove the unmasked portions of the conductive layer. Plasma etching is one such technique. The use of plasma etching in the art of semiconductor fabrication is well known, and will not be discussed in detail. A problem associated with plasma etching, in the case where the conductive layer is contacting the gate of the MOS transistor, is damage to the gate oxide resulting from an accumulation of charge on the conductive layer during the plasma etch step. If the accumulating charge creates a sufficient potential difference across the gate oxide, the oxide layer may be damaged, and permanently degrade the performance of the MOS transistor.

One solution currently employed to protect the gate oxide from charge damage is to couple the interconnect tied to the gate of the MOS transistor to a junction diode formed in the semiconductor substrate. In the case of an NMOS transistor, an n-type region is formed in a p-type substrate. The interconnect is coupled to the np-junction diode by exposing the n-type region during the formation of the contact vias, and then masking and etching the subsequently deposited conductive layer to form an interconnect that is coupled to both the gate of the MOS transistor and to the exposed n-type region. The resulting np-junction diode will provide a conductive path on which negative charge accumulated during the plasma etch step may be discharged into the semiconductor substrate. A sufficient accumulation of negative charge will forward bias the np-junction diode. However, if positive charge accumulates, the np-junction diode will be reversed biased. The positive charge will be discharged into the substrate only as a junction leakage current until the reverse breakdown voltage of the diode is exceeded. In reverse breakdown mode, the np-junction diode will act as a nearly fixed voltage source, and dissipate any accumulated positive charge.

The effectiveness of the previously described solution is reduced as the size of the semiconductor structures in an integrated circuit shrink. For example, as the size of a MOS transistor shrinks, the gate and the gate oxide are scaled accordingly. However, the breakdown voltage of the np-junction diode is not scaled as well, resulting in a relatively greater potential present across the gate oxide of the MOS transistor before the breakdown voltage of the np-junction diode is reached. Thus, the risk of the gate oxide being damaged by charge accumulation during a plasma etch step is also greater.

Therefore, there is a need for a semiconductor structure that can effectively protect the gate oxide of a MOS transistor from charging damage encountered during a plasma etch step.

SUMMARY OF THE INVENTION

A sacrificial conductive path is formed in an integrated circuit to temporarily couple together semiconductor structures of the integrated circuit. The sacrificial conductive path includes a sacrificial area that severs the electrical continuity when it is removed. One aspect of the invention employs the sacrificial conductive path to protect an oxide used as a dielectric in a capacitive structure from charge related damage during a plasma etch step. The capacitive structure is typically formed from a conductive layer overlying the oxide. The sacrificial conductive path couples the conductive layer of the capacitive structure to the semiconductor substrate upon which the capacitive structure is formed. Any charge accumulating on a conductive interconnect coupled to the conductive layer during the etch step may be discharged to the semiconductor substrate. The sacrificial area is left exposed through any subsequent layer overlying the sacrificial conductive layer so that the sacrificial area may be removed prior to operating the integrated circuit.

In a complementary MOS transistor structure, a second sacrificial conductive path is employed to temporarily couple a substrate of a first conductivity type to a well region of a second conductivity type. The second sacrificial conductive path also includes a sacrificial area that severs the connection between the substrate and the well when it is removed. In another aspect of the invention, the second conductive path is a semiconductor fuse that is removed by laser trimming. In another aspect of the invention, only the second sacrificial conductive path is used. The gates of the transistor are coupled to both the substrate and the well region through diode connections.

DETAILED DESCRIPTION OF THE INVENTION

Figure 1:
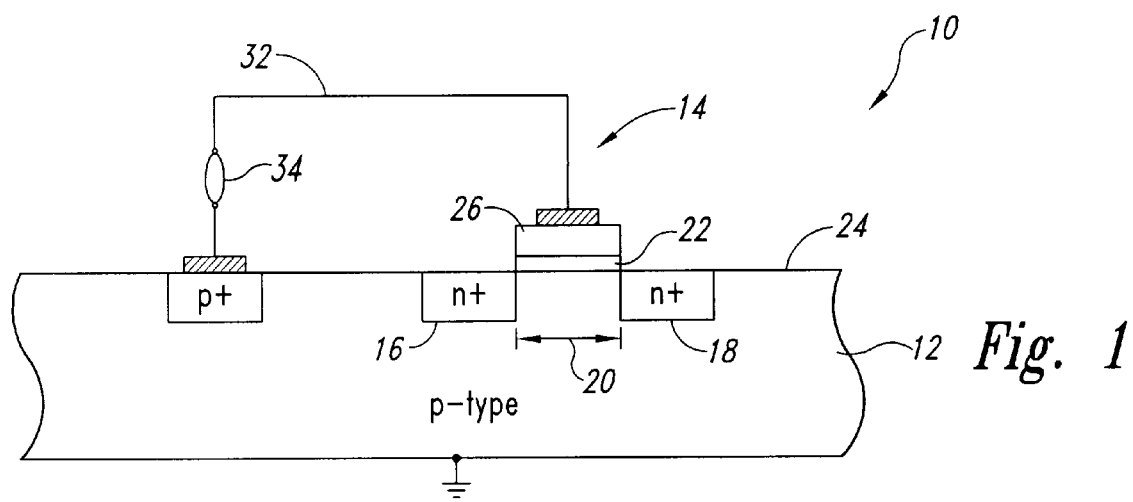
FIG. 1 is a schematic cross-sectional view of an integrated circuit formed according to one embodiment of the present invention.

FIG. 1 is a schematic cross-sectional view of an integrated circuit 10 according to an embodiment of the present invention. The integrated circuit 10 includes a semiconductor substrate 12 in which a number of MOS transistors 14 are formed, one of which is shown in FIG. 1. The term "substrate" is not intended to be limited to a semiconductor wafer, but refers generally to an underlying semiconductor material upon which a device or structure is fabricated. In the illustrated embodiment, the semiconductor substrate 12 is a p-type semiconductor, and the transistor 14 is an NMOS transistor. One skilled in the art will realize, however, that the present invention is equally applicable to integrated circuits formed in n-type semiconductor substrates, or to integrated circuits formed in a well region having a particular conductivity type, that has been formed in the semiconductor substrate. The NMOS transistor 14 includes an n+ source region 16, and an n+ drain region 18 formed in the semiconductor substrate 12. The regions 16 and 18 may be formed through conventional process techniques, such as diffusion or ion implantation of a suitable dopant into the semiconductor substrate 12. The n+ source region 16 is spaced apart from the n+ drain region 18, and a channel 20 of the NMOS transistor 14 defined between these two regions. An insulating layer 22 is formed above the channel region 20 on a surface 24 of the semiconductor substrate 12. Typically, the insulating layer 22 is an oxide, such as silicon dioxide, and is grown or deposited on the surface 24 using known process techniques. A conductive layer, such as a metal or polysilicon layer, is formed on the insulating layer 22 as shown, and forms the gate 26 of the NMOS transistor 14. In operation, a current flows from the drain region 18 through the channel region 20 to the source region 16 when a sufficient voltage is applied to the gate 26 of the NMOS transistor 14, as understood by one skilled in the art.

The integrated circuit 10 further includes a sacrificial conductive path 32 coupling the sate 26 to the semiconductor substrate 12. The sacrificial conductive path 32 includes a sacrificial area 34, where the electrical continuity between the gate 26 and the semiconductor substrate 12 can be broken. The sacrificial conductive path 32 and the sacrificial area 34 are represented in FIG. 1 as a signal line and a severable coupling, however, as will be explained below, the steps for forming the sacrificial conductive path 32 and the sacrificial area 34 can be easily integrated into a typical process flow for a integrated device. The sacrificial conductive path 32 is shown as being coupled to the semiconductor substrate 12 through a p+ region. A person of ordinary skill in the art will appreciate that such a region is necessary in order to form an ohmic contact between the sacrificial conductive path 32 and the semiconductor substrate 12. A person of ordinary skill in the art will also understand that reference to coupling to the semiconductor substrate 12 herein includes such a region.

Figure 2A:
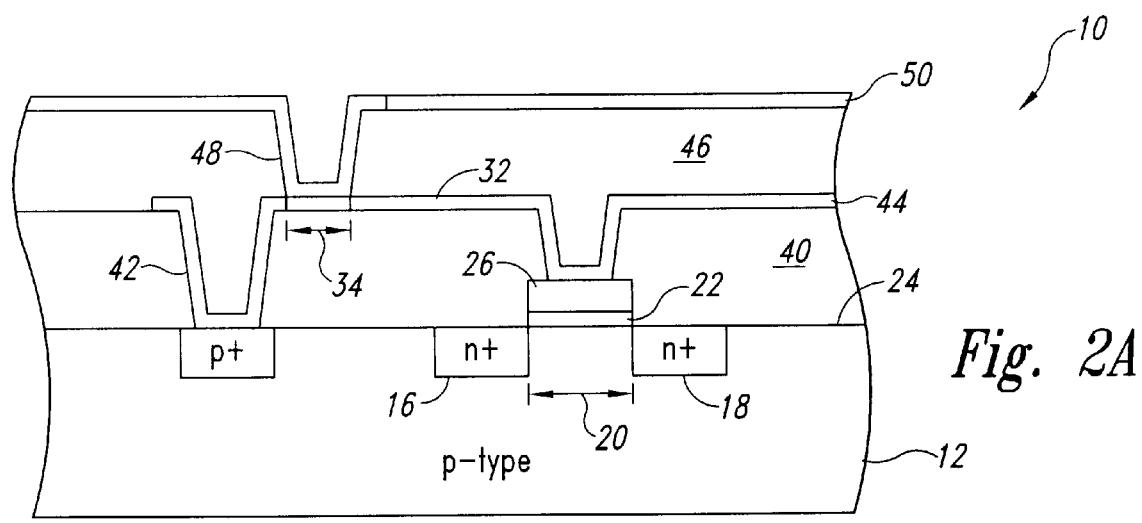
FIGS. 2A–B are cross-sectional views of the integrated circuit illustrated in FIG. 1 at various stages of the formation of the integrated circuit.

FIG. 2A illustrates a cross-section of a semiconductor structure that may be used for the integrated device 10 shown in FIG. 1. As is conventional in the field of integrated circuit representation, the lateral sizes and thicknesses of the various layers are not drawn to scale and these various layers or layer portions are arbitrarily enlarged to improve drawing legibility. Furthermore, like reference numbers are used in the following Figures to identify similar elements.

A first insulating layer 40 is deposited over the existing structure of the transistor 14. A contact via 42 exposing the surface of the semiconductor substrate 24 can be formed during the same mask and etch steps that form contact vias in the insulating layer that expose the gate 26. A metal layer 44 deposited subsequent to the contact etch step will electrically couple the gate 26 to the semiconductor substrate 12. The metal layer 44 is then masked and etched to form the metal lines of the circuit and the sacrificial conductive path 32. Any excessive charge developed on the metal layer 44 during the etch step will be dissipated to the semiconductor substrate 12 through the sacrificial conductive path 32, thereby protecting the insulating layer 22 from damage.

Figure 2B:
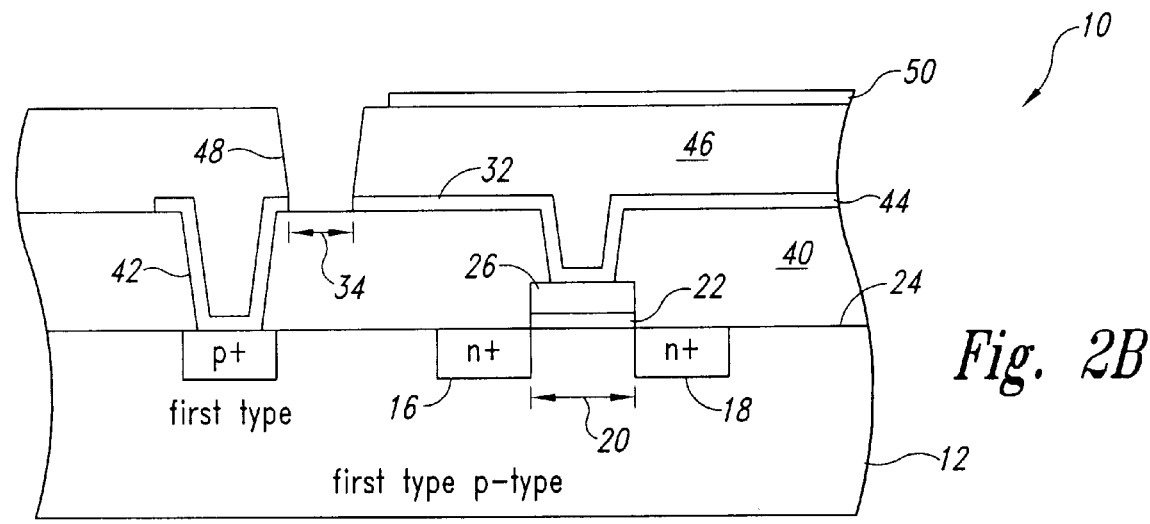

As one ordinarily skilled in the art will appreciate, the gate 26 is coupled to other semiconductor structures, in addition to the semiconductor substrate 12, through the metal layer 44. However, these connections are not shown in FIGS. 2A–B. The sacrificial conductive path 32 may be formed by extending an existing interconnection coupled to the gate 26 to also fill the contact via 42. The sacrificial conductive path 32 may alternatively be formed by forming a separate interconnect from the metal layer 44 with the purpose of coupling the gate 26 to the semiconductor substrate 12. Consequently, the illustration of the integrated circuit 10, shown in FIGS. 2A–B, is meant for illustrative purpose only, and do not limit the scope of the present invention.

The sacrificial area 34, that will be eventually removed to electrically disconnect the gate 26 from the semiconductor substrate 12, can be located anywhere along the length of the sacrificial conductive path 32. The exact position will be determined by the masking and etching steps of subsequent layers. For example, the integrated circuit 10, shown in FIG. 2A, has a semiconductor structure including a second insulating layer 46 deposited after the etch step of the metal layer 44. This will be followed by masking and etching steps to form contact vias in the second insulating layer 46. The mask used to pattern the position of the contact vias in the second insulating layer 46 will have contact via 48 that exposes a portion of the sacrificial conductive path 32. The area exposed by the contact via 48 is the sacrificial area 34 that will be removed by a subsequent metal etch step.

Following the contact via etch step of the second insulating layer 46, a second metal layer 50 is deposited. Consequently, all the areas exposed by the contact vias in the second insulating layer 46 will be electrically connected, including the exposed sacrificial area 34. Any excessive charge that develops on the second metal layer 50 during the second metal layer etch step, will be dissipated to the semiconductor substrate 12 through the sacrificial conductive path 32.

The second metal layer 50 will be masked and etched to form the second metal interconnects of the integrated circuit 10. In a two metal layer semiconductor structure, such as the one shown in FIG. 2B, the sacrificial area 34 will be removed during the second metal layer etch step. A person ordinarily skilled in the art will appreciate that the etch conditions of the second metal etch step should be optimized to etch through the second metal layer 50 that fills the contact via 48 in the second insulating layer 46, and also completely remove the sacrificial area 34 of the underlying sacrificial conductive path 32. Otherwise, the conductive layer 26 will remain connected to the semiconductor substrate 12. After the sacrificial area 34 has been removed by the second metal layer etch step, the transistor 14 will be able to operate normally.

In an integrated device having more than two metal layers (not shown), the sacrificial conductive path may be removed during any of the subsequent metal etch steps, for example, during one of the later etch steps. In such a multi-layer metal structure, a contact via, aligned with the previously formed contact via 42, should be made in each subsequent layer that covers the sacrificial conductive path 32. The "stacked" contact vias will expose the sacrificial area 34 that will ultimately be removed during an etch step. If the aspect ratio of the stacked contact vias is too great for the sacrificial area 34 to be removed during a single metal etch step, a separate mask and etch step can be included in the process with the specific purpose of removing the sacrificial area 34.

Unlike the prior art, which uses an np-junction diode to dissipate excess negative charge, the sacrificial conductive path 32 dissipates both excess positive and negative charge that may accumulate on the first metal layer 44 during a metal etch step. Furthermore, the sacrificial conductive path does not rely on a breakdown voltage of a junction diode to dissipate positive charge. The insulating layer 22 of the transistor 14 is thereby provided with more protection from charge related damage.

Figure 3:
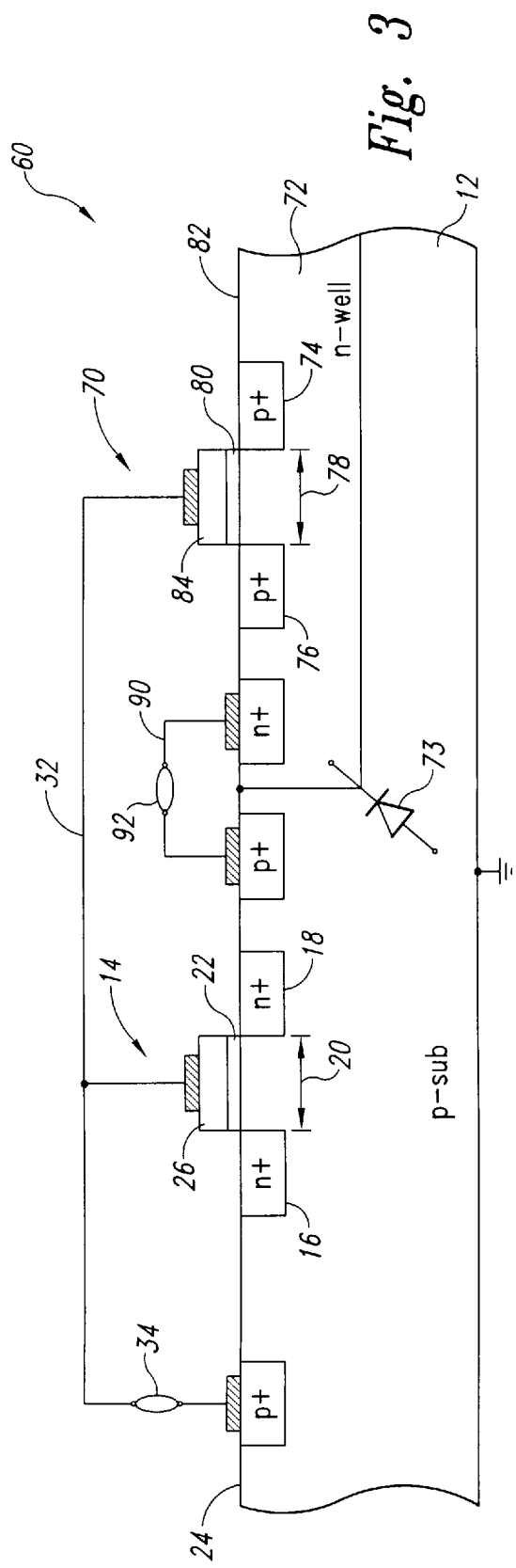
FIG. 3 is a schematic and cross-sectional view of an integrated circuit formed according to another embodiment of the present invention.

Shown in FIG. 3 is another embodiment of the present invention. An integrated circuit 60 includes, in addition to an NMOS transistor 14, a PMOS transistor 70 is formed laterally from the NMOS transistor 14 in an n-well region 72. The n-well region 72 is formed in the semiconductor substrate 12 using conventional process techniques. The np-junction formed between the n-well region 72 and the semiconductor substrate 12 results in a junction diode, represented in FIG. 3 as a junction diode 73. The PMOS transistor 70 includes a p+ source region 74, and a p+ drain region 76 formed in the n-well region 72. A channel 78 is defined between the two p+ regions. An insulating layer 80 is formed above the channel 78 on a surface 82 of the n-well region 72. A conductive layer is formed on the insulating layer 80 as shown, and forms the gate 84 of the PMOS transistor 70. In operation, a current flows from the source region 74 through the channel 78 to the drain region 76 when the voltage applied to the gate 84 exceeds the threshold voltage of the PMOS transistor 70.

Both the gates 22 and 84 are coupled to the semiconductor substrate 12 through the sacrificial conductive path 32. The n-well region 72 is also coupled to the semiconductor substrate 12, but through a second sacrificial conductive path 90. The second sacrificial conductive path 90 includes a sacrificial area 92 that will be eventually removed to sever the electrical connection between the n-well region 72 and the semiconductor substrate 12. The second sacrificial conductive path 90 and sacrificial area 92 may be formed in a manner similar to the sacrificial conductive path 32 and the sacrificial area 34, as described above. That is, using the reference numerals of FIG. 2B for ease of explanation, additional contact vias can be made in the first insulating layer 40 to expose portions of the n-well region 72 and another portion of the surface of the semiconductor substrate 12. The first metal layer 44 deposited onto the insulating layer 40 and into the contact vias will electrically couple the n-well region 72 and the semiconductor substrate 12. The first metal layer 44 is then masked and etched so that the second sacrificial conductive path 90 is formed between the n-well region 72 and the semiconductor substrate 12.

Any excess positive or negative charge developed on the first metal layer 44 during the etch step can be discharged through the sacrificial conductive path 32 to the semiconductor substrate 12, thus protecting the gate oxides 22 and 80 of the transistors 14 and 70 from being damaged. The second sacrificial conductive path 90 ensures that the n-well region 72 is not floating at a different potential than the semiconductor substrate 12 to further protect the gate oxide 80 from being damaged by excessive charge present across the gate oxide 80. The second sacrificial path 90 is not essential where the bulk of the charge accumulating on the first metal layer 44 is positive because the n-well region 72 remains coupled to the semiconductor substrate 12 through the junction diode 73. The junction diode 73 will be forward biased in this situation and any positive charge will be dissipated into the semiconductor substrate 12. The voltage of the n-well region 72 will be one diode voltage above the voltage of the semiconductor substrate 12. However, where the majority of the charge accumulation is negative, the second sacrificial conductive path 90 should be included because the junction diode 73 will be reversed biased and cannot be relied upon to couple the n-well region 72 to the semiconductor substrate 12.

As with the embodiment described with reference to FIGS. 1 and 2, the integrated circuit shown in FIG. 3 will have the continuity of the first and second sacrificial conductive paths 32 and 90 severed prior to completion by etching the sacrificial areas 34 and 92 left exposed by subsequent contact via etch steps. After the sacrificial areas 34 and 92 have been removed, the integrated circuit 60 will be able to operate normally.

Figure 4:
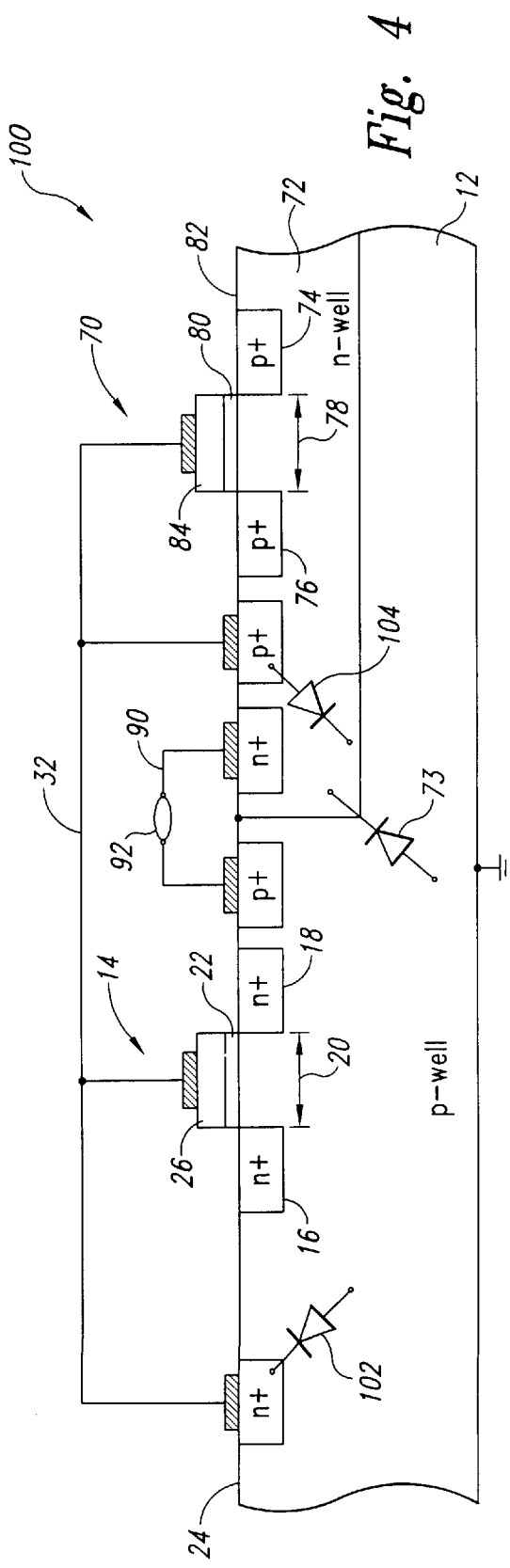
FIG. 4 is a schematic and cross-sectional view of an integrated circuit formed according to another embodiment of the present invention.

Shown in FIG. 4 is another embodiment of the present invention. An integrated circuit 100 includes an NMOS transistor 14 and a PMOS transistor 70. Also included is a second sacrificial conductive path 90 that temporarily couples an n-well region 72 to a semiconductor substrate 12. The continuity of the second sacrificial conductive path 90 will again be severed at the sacrificial area 92 prior to the completion of the integrated circuit 100. However, unlike the embodiment shown in FIG. 3, the gates 26 and 84 of the NMOS and PMOS transistors 14 and 70, respectively, are both coupled to the semiconductor substrate 12 in a manner that is similar to the conventional technique, that is, through an np-junction diode, represented as diode 102, and to the n-well region 72 through a pn-junction diode, represented as diode 104. Both the np-junction diode 102, and the pn-junction diode 104 are formed using conventional process techniques.

The two junction diodes, 102 and 104, and the sacrificial conductive path 90 are used to discharge both excess positive and negative charge developed on the first metal layer during a metal etch step. Excess negative charge is discharged through the np-junction diode 102 to the semiconductor substrate 12. The np-junction diode 102 will be forward biased in this situation. Excess positive charge is discharged through the pn-junction diode 104 to the n-well region 72. The second sacrificial conductive path 90, that couples the n-well region 72 to the semiconductor substrate 12, completes the current path to the semiconductor substrate 12 for the excess positive charge to be discharged. The pn-junction diode 104 will be forward biased in this situation. Therefore, as long as the second sacrificial conductive path 90 remains intact, the gate oxides 22 and 80 of the NMOS and PMOS transistors 14 and 70 will be protected from being damaged by both excess positive and negative charge developed during a plasma etch step. Prior to completion of the integrated circuit 100, the continuity of the second sacrificial conjuctive path 90 must be severed by etching the sacrificial area 92 left exposed by subsequent contact via etch steps. As previously explained, the contact vias will be stacked in a multi-layer metal structure.

In an alternative embodiment, the sacrificial conductive path 90 is a fusable connection that may be severed after the semiconductor structures of the integrated circuit 100 have been completed. For example, a conventional semiconductor fuse, formed early enough in the process to protect the gate oxides 22 and 80 during the etch step of the first metal layer, may be laser trimmed or severed by other means after the integrated circuit 100 has been completed. Once the n-well region 72 has been decoupled from the semiconductor substrate 12, the integrated circuit 100 may function normally. The process of forming a semiconductor fuse and the process of "blowing" it by various means are both well known in the art, and will not be explained in detail herein in the interests of brevity.

After the sacrificial area 92 of the second sacrificial path 90 has been removed, either by etching a sacrificial conductive path or "blowing" a fuse, the gates 26 and 84 will remain coupled to both the np-junction diode 102 and the pn-junction diode 104. In spite of being coupled, the integrated circuit 100 will function normally because under normal operating conditions, the n-well 72 is biased to approximately the internal supply voltage of the integrated circuit 100, and the semiconductor substrate 12 is grounded, or back biased with a negative voltage. Therefore, the junction diodes 73, 102, and 104 will all be reversed biased, preventing any excessive leakage currents in the n-well region 72 or semiconductor substrate 12 during normal operating conditions.

Although, as just explained, the gates 26 and 84 may remain coupled to both junctions diodes 102 and 104, sacrificial conductive paths may be used in the integrated circuit 100 to disconnect the conductive layers 26 and 84 prior to normal operation, if so desired.

Figure 5:
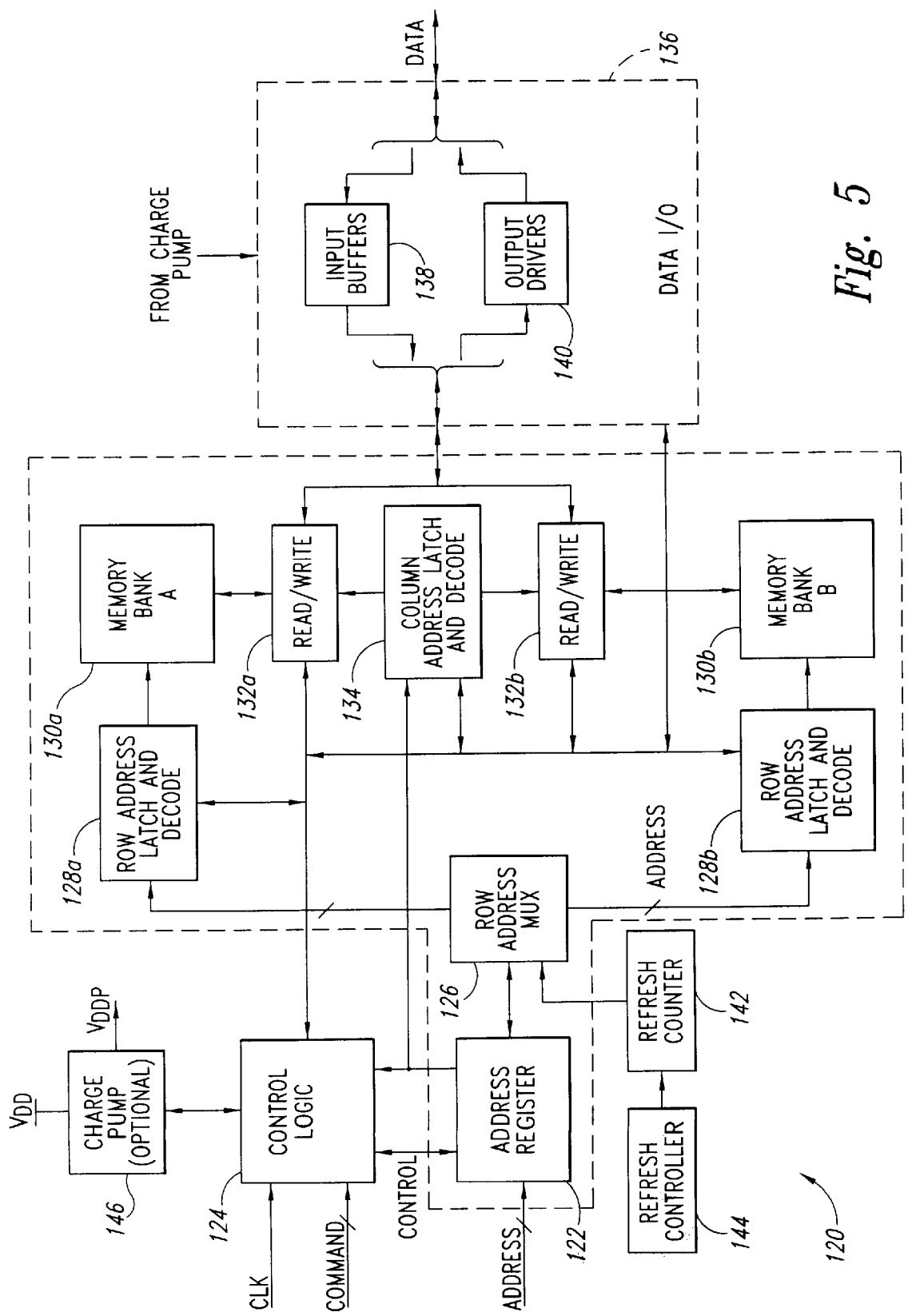
FIG. 5 is a block diagram of a semiconductor memory formed according to the methods described in relation to FIGS. 1–4.

FIG. 5 is a block diagram of one embodiment of a memory circuit 120 that can be formed according to the methods described above in relation to FIGS. 1–4. The memory circuit 120 includes memory banks 130a and 130b. These memory banks each incorporate a memory array according to the invention.

The memory circuit 120 includes an address register 122, which receives an address from an ADDRESS bus. A control logic circuit 124 receives a clock (CLK) signal, receives clock enable (CKE), chip select ($\overline{CS}$), row address strobe ($\overline{RAS}$), column address strobe ($\overline{CAS}$), and write enable ($\overline{WE}$) signals from the COMMAND bus, and communicates with the other circuits of the memory device 120. A row-address multiplexer 126 receives the address signal from the address register 122 and provides the row address to the row-address latch-and-decode circuits 128a and 128b for the memory bank 130a or the memory bank 130b, respectively. During read and write cycles, the row-address latch-and-decode circuits 128a and 128b activate the word lines of the addressed rows of memory cells in the memory banks 130a and 130b, respectively. Read/write circuits 132a and 132b read data from the addressed memory cells in the memory banks 130a and 130b, respectively, during a read cycle, and write data to the addressed memory cells during a write cycle. A column-address latch-and-decode circuit 134 receives the address from the address register 122 and provides the column address of the selected memory cells to the read/write circuits 132a and 132b. For clarity, the address register 122, the row-address multiplexer 126, the row-address latch-and-decode circuits 128a and 128b, and the column-address latch-and-decode circuit 134 can be collectively referred to as an address decoder.

A data input/output (I/O) circuit 136 includes a plurality of input buffers 138. During a write cycle, the buffers 138 receive and store data from the DATA bus, and the read/write circuits 132a and 132b provide the stored data to the memory banks 130a and 130b, respectively. The data I/O circuit 136 also includes a plurality of output drivers 140. During a read cycle, the read/write circuits 132a and 132b provide data from the memory banks 130a and 130b, respectively, to the drivers 140, which in turn provide this data to the DATA bus.

A refresh counter 142 stores the address of the row of memory cells to be refreshed either during a conventional auto-refresh mode or self-refresh mode. After the row is refreshed, a refresh controller 144 updates the address in the refresh counter 142, typically by either incrementing or decrementing the contents of the refresh counter 142 by one. Although shown separately, the refresh controller 144 may be part of the control logic 124 in other embodiments of the memory device 120.

The memory device 120 may also include an optional charge pump 146, which steps up the power-supply voltage $V_{DD}$ to a voltage $V_{DDP}$. In one embodiment, the pump 146 generates VDDP approximately 1–1.5 V higher than $V_{DD}$. The memory circuit 120 may also use $V_{DDP}$ to conventionally overdrive selected internal transistors.

Figure 6:
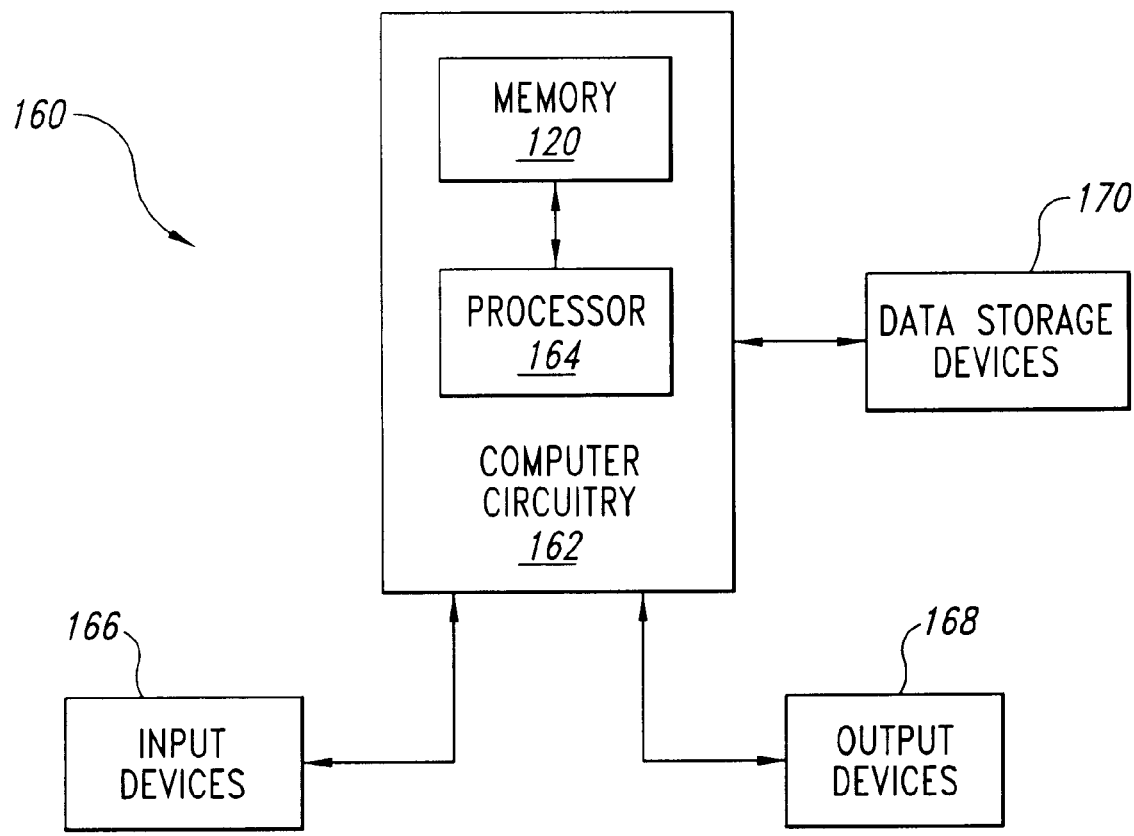
FIG. 6 is a block diagram of a computer system including the semiconductor memory of FIG. 5.

FIG. 6 is a block diagram of an electronic system 160, such as a computer system, that incorporates the memory circuit 120 of FIG. 5. The system 160 also includes computer circuitry 162 for performing computer functions, such as executing software to perform desired calculations and tasks. The circuitry 162 typically includes a processor 164 and the memory circuit 120, which is coupled to the processor 164. One or more input devices 166, such as a keyboard or a mouse, are coupled to the computer circuitry 162 and allow an operator (not shown) to manually input data thereto. One or more output devices 168 are coupled to the computer circuitry 162 to provide to the operator data generated by the computer circuitry 162. Examples of such output devices 168 include a printer and a video display unit. One or more data-storage devices 170 are coupled to the computer circuitry 162 to store data on or retrieve data from external storage media (not shown). Examples of the storage devices 170 and the corresponding storage media include drives that accept hard and floppy disks, tape cassettes, and compact disk read-only memories (CD-ROMs). Typically, the computer circuitry 162 includes address data and command buses and a clock line that are respectively coupled to the ADDRESS, DATA, and COMMAND buses, and the CLK line of the memory device 120.

From the foregoing it will be appreciated that, although specific embodiments of the invention have been described herein for purposes of illustration, various modifications may be made without deviating from the spirit and scope of the invention. The embodiments of the invention have been explained with regard to temporarily connecting the gate of a transistor to a substrate in order to protect the gate oxide from being damage during a metal etch step. However, the method and structure described for forming a sacrificial conductive path may be used to protect the oxide layer of other semiconductor structures, such as capacitors and antifuses, by temporarily coupling the conductive layers of the structures to the semiconductor substrate. Furthermore, the sacrificial conductive path may be used to couple together other semiconductor structures that have not been mentioned specifically. For example, the sacrificial conductive path may be used to temporarily couple the gates of two transistors together to ensure that neither one is floating, or to temporarily couple a source region to the substrate or well region during a gate etch. Accordingly, the invention is not limited except as by the appended claims.

What is claimed is:

1. An integrated circuit, comprising:

a substrate having a first conductivity type;

a well region formed in the substrate having a second conductivity type opposite of the first conductivity type;

a capacitive structure formed on the substrate, the capacitive structure formed by an insulating layer disposed between the substrate and a conductive layer; and a conductive path coupling the conductive layer to the substrate through a doped region formed in the substrate having the first conductivity type, the conductive path having a removable portion to decouple the conductive layer from the substrate when removed.

2. The integrated circuit of claim 1, further comprising:

a second capacitive structure formed on the well region having an oxide and a conductive layer, the conductive layer of the second capacitive structure also being coupled to the substrate through the conductive path and the doped region, the second capacitive structure decoupled from the substrate when the removable portion is removed.

3. The integrated circuit of claim 2, further comprising a second conductive path temporarily coupling the well region to the substrate and having a removable portion to decouple the region from the substrate when removed, the conductive path coupled to the well region through a second doped region having the second conductivity type and coupled to the substrate through a third doped region having the first conductivity type.

4. The integrated circuit of claim 2 wherein the conductivity type of the well region is n-type and the conductivity type of the substrate is p-type.

5. The integrated circuit of claim 3 wherein the conductive path comprises a fuse, and the removable portion being removed by laser trimming.

6. The integrated circuit of claim 1, further comprising a insulating layer formed over the capacitive structure, well region and substrate, and wherein the conductive path comprises:

a first contact hole formed in the insulating layer to expose a portion of the doped region;

a second contact hole formed in the insulating layer to expose a portion of the conductive layer of the capacitive structure; and a second conductive path formed on the insulating layer and on the exposed portions of the doped region and conductive layer of the capacitive structure, the removable portion of the second conductive path removable by etching.

7. The integrated circuit of claim 1, further comprising a source and drain region formed in the substrate adjacent to the capacitive structure, the capacitive structure, and the source and drain regions forming a MOSFET transistor.

8. An integrated circuit, comprising, a substrate having a first conductivity type;

a well region formed in the substrate and having a second conductivity type opposite of the first conductivity type;

a dielectric layer formed on the substrate;

a conductive layer formed on the dielectric layer; and a first sacrificial conductive path electrically coupling the conductive layer to the substrate through a doped region formed in the substrate and having the first conductivity type, the first sacrificial conductive path having a sacrificial area to electrically decouple the conductive layer from the substrate when removed and adapted to conduct current having either positive or negative polarity, with respect to the conductive layer.

9. The integrated circuit of claim 8, further comprising:

a second dielectric layer formed on the well region; and a second conductive layer formed on the second dielectric layer, the second conductive layer also being electrically coupled to the substrate through the sacrificial conductive path and the doped region, the second conductive layer electrically decoupled when the sacrificial area is removed.

10. The integrated circuit of claim 9, further comprising a second sacrificial conductive path electrically coupling the well region to the substrate and having a sacrificial area to electrically decouple the region from the substrate when removed, the second sacrificial conductive path coupled to the substrate through a second doped region having the first conductivity type and coupled to the well region through a third doped region having the second conductivity type.

11. The integrated circuit of claim 10, further comprising an insulating layer formed over the substrate, the well region, and the first and second conductive layers, and wherein the first sacrificial conductive path comprises:

first and second contacts formed in the insulating layer to expose a portion of the first and second conductive layers, respectively;

a third via formed in the insulating layer to expose a portion of the doped region; and a conductive layer formed on the insulating layer and on the exposed portions of the doped region, and the first and second conductive layers, the conductive layer further having an exposed portion removable by etching.

12. The integrated circuit of claim 10 wherein the second sacrificial conductive path comprises a fuse, and the sacrificial area is removed by laser trimming.

13. The integrated circuit of claim 10, further comprising an insulating layer formed over the substrate, the region, and the first and second conductive layers, and wherein the second sacrificial conductive path comprises:

first and second contacts formed in the insulating layer to expose a portion of the second and third doped regions, respectively; and a conductive path formed on the insulating layer and on the exposed portions of the second and third doped regions, the conductive path further having an exposed portion removable by etching.

14. The integrated circuit of claim 8, further comprising a source and a drain region formed in the substrate adjacent to the dielectric layer, the conductive layer, dielectric layer, and the source and drain regions forming a MOSFET transistor.

15. An integrated circuit, comprising:

a substrate having a first conductivity type;

a region formed in the substrate having a second conductivity type opposite of the first conductivity type;

a first capacitive structure formed on the substrate, the first capacitive structure having an insulating layer disposed between the substrate and a first conductive gate;

a second capacitive structure formed on the region, the second capacitive structure having an insulating layer disposed between the region and a second conductive gate;

a first unidirectional current path coupling the conductive gates of the first and second capacitive structure to the substrate, and carrying current having a first polarity;

a second unidirectional current path coupling the conductive gates of the first and second capacitive structure to the region, and carrying current having a second polarity; and a sacrificial conductive path coupling the region to the substrate and having a removable portion to decouple the region from the substrate when removed, the sacrificial conductive path coupled to the substrate through a first doped region formed in the substrate and having a first conductivity type and coupled through a second doped region formed in the region having.

16. The integrated circuit of claim 15 wherein the first unidirectional current path comprises a junction diode formed in the substrate.

17. The integrated circuit of claim 15 wherein the second unidirectional current path comprises a junction diode formed in the region.

18. The integrated circuit of claim 15 wherein the first conductivity type is p-type and the second conductivity type is n-type.

19. The integrated circuit of claim 15 wherein the sacrificial conductive path comprises a fuse, and the removable portion being removed by blowing the fuse.

20. The integrated circuit of claim 15, further comprising an insulating layer formed over the substrate, the region, and the first and second capacitive structures, and wherein the sacrificial conductive path comprises:

a first and second contacts formed in the insulating layer to expose a portion of the first and second doped regions, respectively; and a conductive path formed on the insulating layer and on the exposed portions of the first and second doped regions, the conductive path further having an exposed portion removable by etching.

21. The integrated circuit of claim 15, further comprising:

first source and drain regions of the second conductivity type formed in the substrate adjacent to the first capacitive structure, the first capacitive structure, and the source and drain regions forming a first transistor; and second source and drain regions of the first conductivity type formed in the region adjacent to the second capacitive structure, the second capacitive structure, and the source and drain regions forming a second transistor.

22. The integrated circuit of claim 15 wherein the first and second capacitive structures form a gate and a gate oxide of a MOSFET transistor.

23. A memory device, comprising:

a semiconductor substrate having a first conductivity type;

a region formed in the substrate having a second conductivity type opposite of the first conductivity type;

an integrated circuit formed on the substrate, the integrated circuit comprising a plurality of circuit components interconnected by conductive lines, the circuit components including components having respective electrodes coupled to at least one conductive line, the electrodes coupled to at least one conductive line, the electrodes being separated from the substrate by respective layers of insulative material, the circuit components forming a memory array, addressing circuitry, control circuitry, and data path circuitry; and a plurality of conductive paths respectively coupling the electrodes of at least some of the circuit components to the substrate through at least one doped region formed in the substrate and having a first conductivity type, each of the conductive paths having a severable portion to decouple the electrodes from the substrate when the severable portion is severed.

24. The memory device of claim 23 wherein at least some of the circuit components having electrodes separated from the substrate by respective layers of insulative material comprises MOSFET transistors in which the electrodes comprise the gates of the MOSFET transistors.

25. The memory device of claim 23, further comprising at least one second conductive path coupling the region to the substrate and having a severable portion to decouple the region from the substrate when severed, the second conductive path coupled to the substrate through a second doped region formed in the substrate and having a first conductivity type and coupled to the region through a third doped region formed in the region and having a second conductivity type.

26. The memory device of claim 25 wherein the conductivity type of the region is n-type and the conductivity type of the semiconductor substrate is p-type.

27. The memory device of claim 25 wherein at least one of the plurality of conductive paths comprises a fuse, and the severable portion being removed by laser trimming.

28. The memory device of claim 23, further comprising a second insulating layer formed over the capacitive structure and the semiconductor substrate, wherein the plurality of conductive paths comprise:

a first contact hole formed in the second insulating layer to expose a portion of the doped region;

a second contact hole formed in the second insulating layer to expose a portion of at least one electrode; and a conductive layer formed on the second insulating layer and on the exposed portions of the doped region and the at least one electrode, the severable portion of the conductive layer severable by etching.

29. An electronic system, comprising:

a data input device;

a data output device; and computing circuitry coupled to the data input and output devices, the computing circuitry including a memory circuit, the memory circuit having, a semiconductor substrate having a first conductivity type;

a region formed in the substrate and having a second conductivity type opposite of the first conductivity type;

an integrated circuit formed on the substrate, the integrated circuit comprising a plurality of circuit components interconnected by conductive lines, the circuit components including components having respective electrodes coupled to at least one conductive line, the electrodes coupled to at least one conductive line, the electrodes being separated from the substrate by respective layers of insulating material, the circuit components forming a memory array, addressing circuitry, control circuitry, and data path circuitry; and a plurality of conductive paths respectively coupling the electrodes of at least some of the circuit components to the substrate through at least one doped region formed in the substrate and having the first conductivity type, each of the conductive paths having a severable portion is severed.

30. The electronic system of claim 29, wherein at least some of the circuit components are formed on the region, and the respective electrodes are coupled to the substrate through some of the plurality of conductive paths.

31. The electronic system of claim 30, further comprising at least one second conductive path coupling the region to the substrate and having a severable portion to decouple the region from the substrate when severed, the second conductive path coupled to the substrate through a second doped region formed in the substrate and having the first conductivity type and coupled to the region through a third coped region formed in the region and having the second conductivity type.

32. The electronic system of claim 21 wherein the conductivity type of the region is n-type and the conductivity type of the semiconductor substrate is p-type.

33. The electronic system of claim 30 wherein at least one of the plurality of conductive paths comprises a fuse, and the severable portion being removed by laser trimming.

34. The electronic system of claim 29 wherein the plurality of conductive paths comprise:
   a first contact hole formed in the second insulating layer to expose a portion of the doped region;
   a second contact hole formed in the second insulating layer to expose a portion of at least one electrode; and
   a conductive layer formed on the second insulating layer and on the exposed portions of the doped region and the at least one electrode, the severable portion of the conductive layer severable by etching.

35. The electronic system of claim 29 wherein at least some of the circuit components having electrodes separated from the substrate by respective layers of insulating material comprises MOSFET transistors in which the electrodes comprise the gates of the MOSFET transistors.

* * * * *

UNITED STATES PATENT AND TRADEMARK OFFICE
CERTIFICATE OF CORRECTION

PATENT NO. : 6,433,403 B1
DATED : August 13, 2002
INVENTOR(S) : John R. Wilford

It is certified that error appears in the above-identified patent and that said Letters Patent is hereby corrected as shown below:

<u>Title page,</u>
Item [56], OTHER PUBLICATIONS, reads "vol. 45, Mar. 1998," should read
-- vol. 45, no. 3, Mar. 1998, --

<u>Column 3,</u>
Line 40, reads "coupling the sate" should read -- coupling the gate --
Line 49, reads "flow for a integrated" should read -- flow for an integrated --

<u>Column 4,</u>
Line 24, reads "do not limit" should read -- does not limit --

<u>Column 7,</u>
Line 27, reads "both junctions diodes" should read -- both junction diodes --

<u>Column 8,</u>
Line 54, reads "from being damage" should read -- from being damaged --

<u>Column 9,</u>
Line 38, reads "comprising a" should read -- comprising an --

<u>Column 11,</u>
Line 14, reads "having." should read -- having the first conductivity type. --

<u>Column 12,</u>
Line 65, reads "portion is severed" should read -- portion that is severed --
Line 66, reads "of claim 29, wherein" should read -- of claim 29 wherein --

<u>Column 13,</u>
Line 12, reads "of claim 21" should read -- of claim 30 --

Signed and Sealed this

Twenty-ninth Day of April, 2003

JAMES E. ROGAN
*Director of the United States Patent and Trademark Office*